United States Patent [19]
Doi et al.

[11] Patent Number: 5,982,019
[45] Date of Patent: *Nov. 9, 1999

[54] SEMICONDUCTOR DEVICE WITH A DIFFUSED RESISTOR

[75] Inventors: Hiroyuki Doi, Katano; Yasushi Hazama, Uozu, both of Japan

[73] Assignee: Matsushita Electronics Corporation, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/843,603

[22] Filed: Apr. 16, 1997

[30] Foreign Application Priority Data

Apr. 19, 1996 [JP] Japan ................. 8-098268

[51] Int. Cl.⁶ .......... H01L 29/00; H01L 27/148; H01L 29/768
[52] U.S. Cl. ............. 257/536; 257/528; 257/218
[58] Field of Search ................. 257/528, 535, 257/218, 536, 379, 488, 549

[56] References Cited

U.S. PATENT DOCUMENTS

| | | | |
|---|---|---|---|
| 3,879,236 | 4/1975 | Langdon | 257/536 |
| 4,223,335 | 9/1980 | Kane | 257/549 |
| 4,321,616 | 3/1982 | Bise | 257/536 |
| 4,510,517 | 4/1985 | Tanabe et al. | 357/34 |
| 4,828,629 | 5/1989 | Ikeda et al. | 257/379 |
| 4,947,232 | 8/1990 | Ashida et al. | 257/488 |
| 5,181,092 | 1/1993 | Atsumi | 257/361 |
| 5,608,259 | 3/1997 | DeShazo et al. | 257/547 |
| 5,831,317 | 11/1998 | Shimazaki | 257/401 |

FOREIGN PATENT DOCUMENTS 06045601 2/1994 Japan .

*Primary Examiner*—Mahshid Saadat
*Assistant Examiner*—Jesse A. Fenty
*Attorney, Agent, or Firm*—Ratner & Prestia

[57] ABSTRACT

The object of the semiconductor apparatus to be used in the semiconductor integrated circuit is to restrain the time dependent fluctuations of the resistance value. To achieve the object, the semiconductor apparatus comprises an active area formed on one conductive type semiconductor substrate surface, a first impurity diffusion layer formed on the active area, of an inverted conductive type reverse in characteristics from the one conductive type, a second impurity diffusion layer of the reverse conductive type formed to cover the first impurity diffusion layer, and an electrode film formed through a field oxide film on the second impurity diffusion layer. The electric potential of the electrode film is kept at an electric potential where a majority carrier is induced into the second impurity diffusion layer.

7 Claims, 7 Drawing Sheets

SEMICONDUCTOR DEVICE WITH A DIFFUSED RESISTOR

BACKGROUND OF THE INVENTION

1. Field of the Invention

The present invention relates to a semiconductor apparatus and more particularly, to a semiconductor apparatus provided with a semiconductor resistance area using impurity diffusion layers.

2. Related Art of the Invention

In recent years, a high voltage-withstanding semiconductor apparatus has been mounted in the output circuit of a microcomputer for directly driving a fluorescent display tubes. During the promotion of the higher performance of the semiconductor integrated circuit, further precision is demanded for a semiconductor apparatus provided with a resistance area in the high voltage-withstanding semiconductor apparatus to be used in the output circuit.

The conventional semiconductor apparatus will be described hereinafter with reference to the drawings.

FIG. 6 (A) is a plan view showing the essential portions of the conventional semiconductor apparatus. FIG. 6 (B) is a sectional view taken along a line A-B of FIG. 6 (A) (for example: Japanese Application Laid-Open No. Hei 6-45601).

In the semiconductor apparatus, an impurity diffusion layer 2 provided on the surface of the N-type semiconductor substrate 1 of a face bearing (100) is a P-type impurity diffusion layer which becomes a mother body of a resistor. The semiconductor substrate 1 is made of silicon. The PN function between the semiconductor substrate 1 and the impurity diffusion layer 2 on the surface of the semiconductor substrate 1 is positioned beneath the field oxide film 3. Thus, the function between the semiconductor substrate 1 and the impurity diffusion layer 2 can withstand the voltage of approximately +60V, so as to realize the higher pressure withstanding operation.

The active area 4 is not covered with a field oxide film 3 on the impurity diffusion layer 2. The P-type impurity diffusion layer 5 with the impurity concentration being approximately middle is provided in the area 4. The impurity diffusion layer 5 is formed so that the impurity concentration thereof may made higher than that on the surface of the impurity diffusion layer 2, and the diffusion depth thereof may be shallower than that of the impurity diffusion layer 2. The impurity diffusion layers 2 and 5 are respectively made optimal in impurity concentration for desired resistance value and pressure withstanding.

The impurity diffusion layers 6 and 7 are provided respectively for electric ohmic contact among aluminum electrodes 9, 10, and an impurity diffusion layer (including an impurity diffusion layer 2). The aluminum electrodes 9 and 10 are respectively connected with impurity diffusion impurity diffusion layers 6 and 7 through holes provided in a layer insulating film 8.

Two resistors composed of each of the impurity diffusion layer 2 and 5 can be connected in parallel in the semiconductor apparatus (hereinafter referred to as a semiconductor resistance apparatus) constructed as described above. The dispersion of the resistance values can be made smaller than that of the resistances value when the impurity diffusion layer 2 or the impurity diffusion layer 5 is formed singly. The dispersion of the resistance values can be restrained even if the resistance values of the impurity diffusion layer 2 are dispersed, because the concentration of the impurity diffusion layer 2 where the dispersion of the resistance values is originally less in terms of the manufacturing step is set higher than that of the diffusion diffusion layer 2. Therefore, an apparatus can be realized where the dispersion of the resistance values is smaller as a whole. Reasons why the resistance values of the impurity diffusion layer 5 are hard to disperse originally in terms of relationship of the manufacturing step are as follows.

Namely, the other successive steps which can give changes to the resistance values are reduced in the case of the impurity diffusion layer 5. In the case of the impurity diffusion layer 2, there are many factors which can change the initial resistance values, because many other steps such as thermal treating steps or the like are available after the impurity diffusion layer 2 has been formed.

The input output circuit using the semiconductor resistance apparatus constructed as in FIG. 6 (A) through FIG. 6 (B) will be described with the use of FIG. 7.

The source of the P channel transistor 100 is connected with a Vdd power source (+5V) and the drain is connected with the output terminal 102 and one end of the semiconductor resistance apparatus 101. The other end of the semiconductor resistance apparatus 101 is connected with the Vpp power source (-30V). The fluorescent display tube is connected with the output terminal 102. The florescent display tube can be equivalently regarded as capacity 104.

In the conductive condition of the P channel transistor 100, the electric potential of the output terminal 102 rises up to an approximate power voltage Vdd. In the non-conductive condition, it drops down to the power voltage Vpp.

The semiconductor resistance apparatus 101 corresponds to the conventional semiconductor apparatus in FIG. 6 (A) through FIG. 6 (B). The impurity diffusion layer 6 shown in FIG. 6 is connected with the output terminal 102, the impurity diffusion layer 7 is connected with the Vpp power source (-30V), and the N-type silicon substrate 1 is connected with the Vdd power source (+5V). Thus, the semiconductor resistance apparatus 101 functions as the high resistance of an inverter for outputting the high voltage.

However, the conventional semiconductor apparatus had a problem in that the resistance value was sometimes varied largely as time passed by long hours' use, and especially under higher temperatures. Or causes made by such time dependent changes were not explained.

SUMMARY OF THE INVENTION

The present invention is devised to overcome the problem of the conventional semiconductor apparatus. One object of the invention is to provide a semiconductor apparatus which can more restrain the time dependent fluctuation in resistance value than before.

The invention is a semiconductor apparatus comprising: an active area formed on a first conductive type semiconductor substrate or the first conductive type well surface; a first impurity diffusion layer formed on the active area, of an inverted conductive type having a substantially contrary characteristics to the first conductive type; a second impurity diffusion layer, of the inverted conductive type, formed to cover the first impurity diffusion layer; and an electrode film formed, through at least a field oxide film, on the second impurity diffusion layer, wherein an electric potential of the electrode film is made an electric potential where a majority carrier is induced into the second impurity diffusion layer.

By the configurations thereof, for example, the electrode film formed on the field oxide film can be retained into an electric potential where the majority carrier can be induced into the impurity diffusion layer as resistor so that electric influences caused by the carriers trapped in the field oxide film can be reduced considerably, so as to effectively restrain the time dependent fluctuation of the resistance values.

BRIEF DESCRIPTION OF THE DRAWINGS

FIG. 2 (B) is a sectional view taken along a line of C-D of FIG. 1;

FIG. 3 (B) is a sectional view taken along a line of A-B of FIG. 3 (A);

FIG. 4 (B) is a sectional view taken along a line of A-B of FIG. 3 (A);

FIG. 6 (B) is a sectional view taken along a line of A-B of FIG. 6 (A); and

DESCRIPTION OF THE REFERENCE NUMERALS

Figure 1:
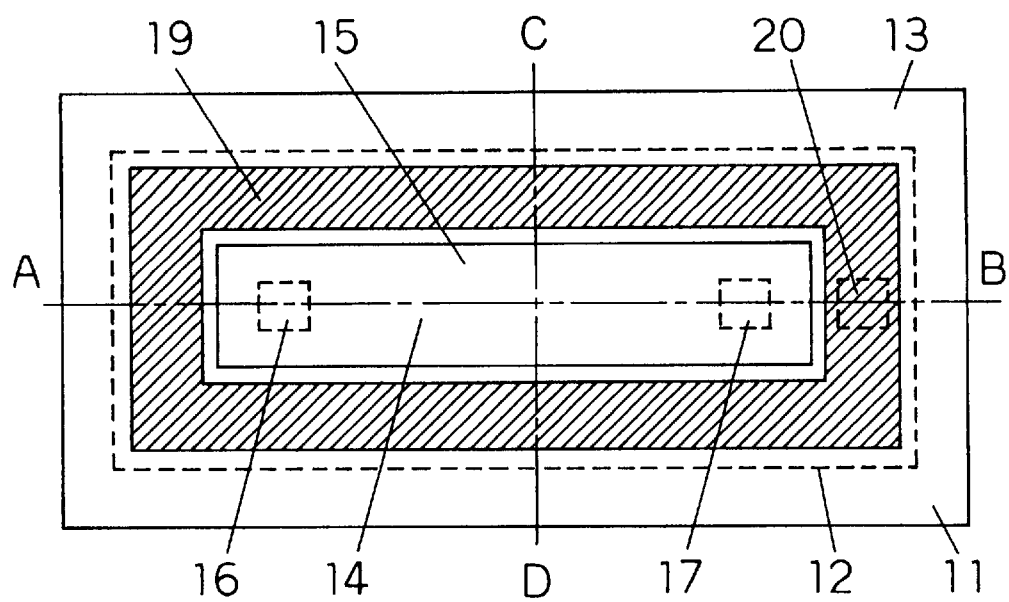
FIG. 1 is a plan view in a first embodiment of a semiconductor apparatus of the invention.

11 . . . semiconductor substrate
12 . . . second impurity diffusion layer
13 . . . field oxide film
14 . . . active area
15 . . . first impurity diffusion layer
16, 17 . . . impurity diffusion layer
18 . . . layer insulation film
19 . . . electrode film
20 . . . contact hole
21 through 23 . . . aluminum electrode

DESCRIPTION OF THE PREFERRED EMBODIMENTS The embodiments of the invention will be described hereinafter with reference to drawings.

(First Embodiment)

Figure 2A:
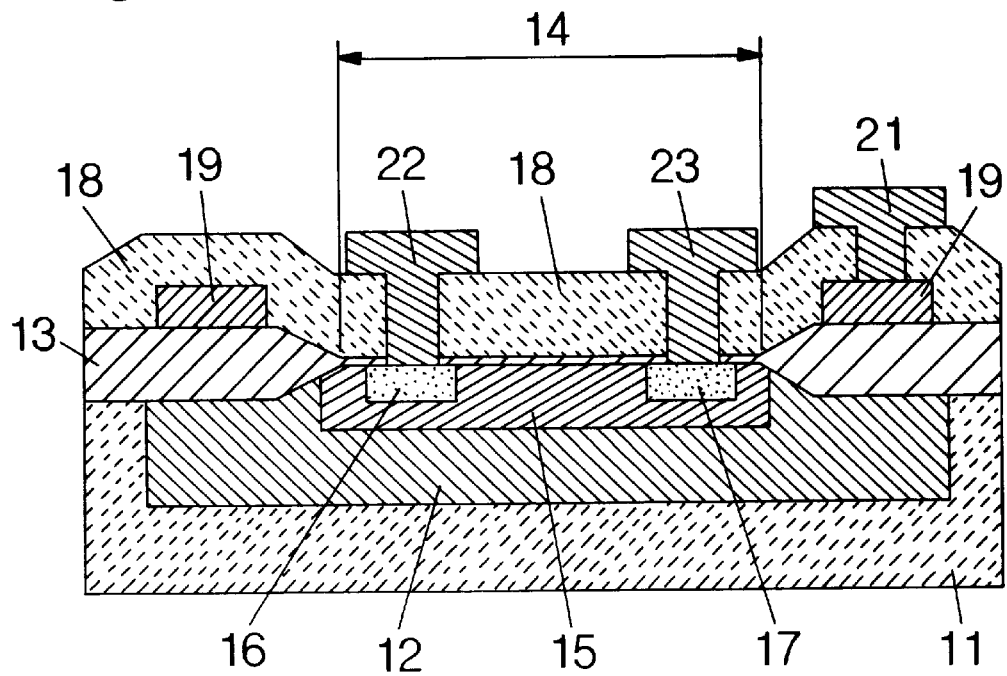
FIG. 2 (A) is a sectional view taken along a line of A-B of FIG. 1.
Figure 2B:
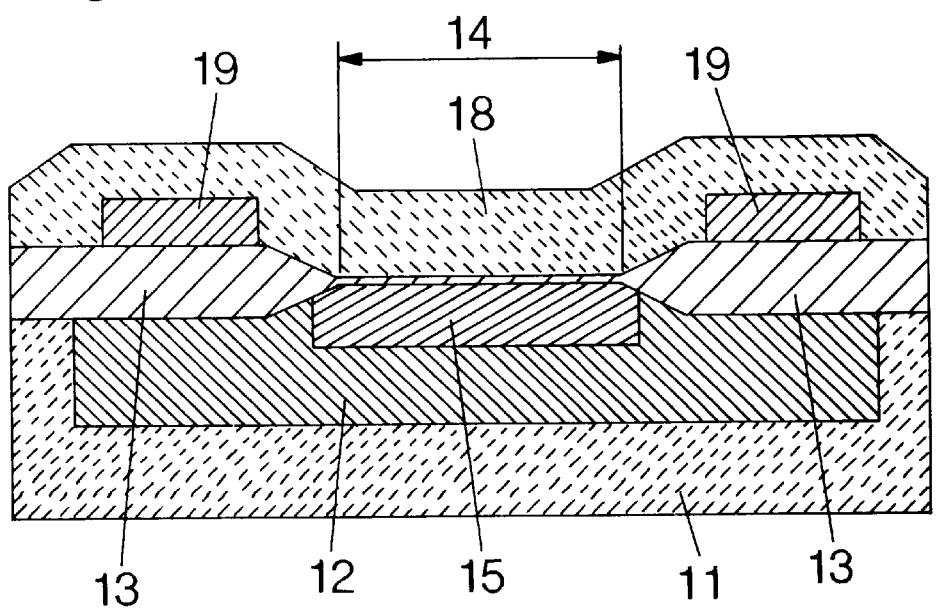
Figure 7:
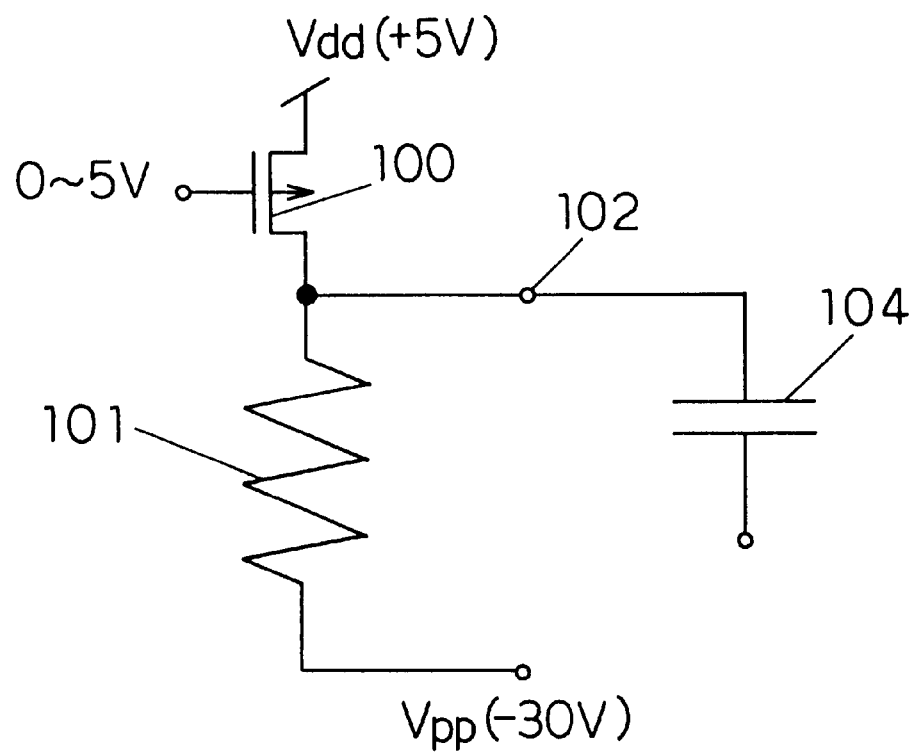
FIG. 7 is a diagram showing the configuration of an input output circuit using the semiconductor apparatus of FIG. 6 (A) through FIG. 6 (B).

FIG. 1 is a plan view of a semiconductor apparatus of a first embodiment of the invention. FIG. 2 (A) is a sectional view taken along a line A-B of FIG. 1. FIG. 2 (B) is a sectional view taken along a line of C-D of FIG. 1. Also, like parts in FIG. 7 are designated by like reference numerals throughout the accompanying drawings. Referring now to the drawings, the configuration of the embodiment will be described hereinafter.

Referring to FIG. 1 and FIG. 2 (A), FIG. 2 (B), reference numeral 11 is a semiconductor substrate, reference numeral 12 is a second impurity diffusion layer, reference numeral 13 is a field oxide film, reference numeral 14 is an active area, reference numeral 15 is a first impurity diffusion layer, reference numeral 16 is an impurity diffusion layer, reference numeral 17 is an impurity diffusion layer, reference numeral 18 is a layer insulation film, reference numeral 19 is an electrode film, reference numeral 20 is a contact hole provided on the electrode film 19. Reference numerals 21 through 23 are aluminum electrodes.

The second impurity diffusion layer 12 is a P-type impurity diffusion layer, which becomes a mother body of the semiconductor resistance apparatus, provided on the surface of the semiconductor substrate 11 (approximate 10 Ω•cm in specific resistance) made of N-type silicon of face bearing (100). The impurity concentration of the second impurity diffusion layer 12 is approximately $1 \times 10^{15}$ through $1 \times 10^{17}$ cm$^{-3}$ and the diffusion depth thereof is approximately 3 through 5 μm. The PN sealing between the semiconductor substrate 11 appeared on the surface of the semiconductor substrate 11 and the second impurity diffusion layer 12 is positioned below the field oxide film 13.

The semiconductor substrate 11 is connected with the Vdd power source (+5V).

The active area 14 is provided on the second impurity diffusion layer 12, being an area not covered with the filed oxide film 13. The P-type first impurity diffusion layer 15 is provided within the active area 14. The first impurity diffusion layer 15 is approximately $1 \times 10^{17}$ through $1 \times 10^{18}$ cm$^3$ in impurity concentration thereof. The first impurity diffusion layer 15 is higher in surface impurity concentration than the second impurity diffusion layer 12.

The diffusion depth of the impurity diffusion layer 15 is approximately 0.5 μm. The desired resistance value (approximately 70 kΩ) and withstanding voltage (approximately −60V) can be realized within the aforementioned range by the use of the impurity concentration and the diffusion depth of the second impurity diffusion layer 12 and the first impurity diffusion layer 15.

The electrode film 19 is provided to surround the active area 14 like a ring through at least a field oxide film 13 on the second impurity diffusion layer 12 and is connected with the Vpp power source (−30V) so that the majority carrier can be induced. It is needless to say that similar effects can be obtained even if the electrode film 19 is expanded not only on the second impurity diffusion layer 12, but also on the semiconductor substrate 11. With the use of polysilicon or the like for the electrode film 19, the gate electrode of a transistor can be formed at the same time. The contact hole 20 is provided on the electrode film 19. The electrode film 19 is connected with the aluminum electrode 21 through the layer insulation film 18.

The active area 14 has impurity diffusion layers 16 and 17 each having a P-type higher impurity concentration therein. The impurity diffusion layers 16 and 17 are provided in the second impurity diffusion layer 12 and the first impurity diffusion layer 15 for electric ohmic contact. The impurity diffusion layers 16 and 17 are approximately $1 \times 10^{21}$ cm$^{-3}$ in impurity concentration. The impurity diffusion layers 16 and 17 are connected respectively with aluminum electrodes 22 and 23 through the layer insulation film 18. The aluminum electrode 23 is connected with the Vpp power source (−30V). The aluminum electrode 22 is connected so that a P-channel transistor 100 may become Vdd (+5V) in a conductive condition.

The operation of the semiconductor apparatus constructed as described above will be described hereinafter. The contents described by the inventors will be explained at the same time about causes for making the resistance values fluctuate largely as time passes.

The semiconductor apparatus in the embodiment is the same in basic operation as the conventional semiconductor apparatus shown in FIG. 7. The operation is different in that the potential for inducing the majority carrier is retained in the second impurity diffusion layer which becomes a resistor, because the electrode film 19 in FIG. 1 is connected with the Vpp (−30V).

The contents explained by the inventors are as follows.

Namely, according to the idea of the inventors, the time dependent fluctuations of the resistance value in the semiconductor resistance apparatus are not caused due to the traps of the majority carrier (here hole) into the field oxide film 13 through the leaking current at the high voltage application time.

Namely, since the second impurity diffusion layer 12 is formed in the comparatively lower concentration, an empty layer is likely to be spread into the second impurity diffusion layer 12 due to traps of the majority carrier and the effective sectional area as the resistor is reduced, so as to cause the fluctuations of the resistance value.

In accordance with such an idea, in the semiconductor apparatus of the embodiment, the electrode film 19 is constructed to retain such a potential as to induce the majority carrier (here hole) in the second impurity diffusion layer 12.

Namely, the electrode film 19 is brought into connection with the Vpp (−30V) as described above to draw the majority carrier from the second impurity diffusion carrier 12 towards the interface neighborhood of the field oxide film 13 and the second impurity diffusion layer 12. Majority carrier is stored near the interface, so as to store the walls of the majority carrier. Therefore, the traps of the majority carrier into the aforementioned field oxide film 13 are restricted so that the empty layer is hard to spread into the second impurity diffusion layer 12, so as to restrain the fluctuations of the resistance value.

Figure 5:
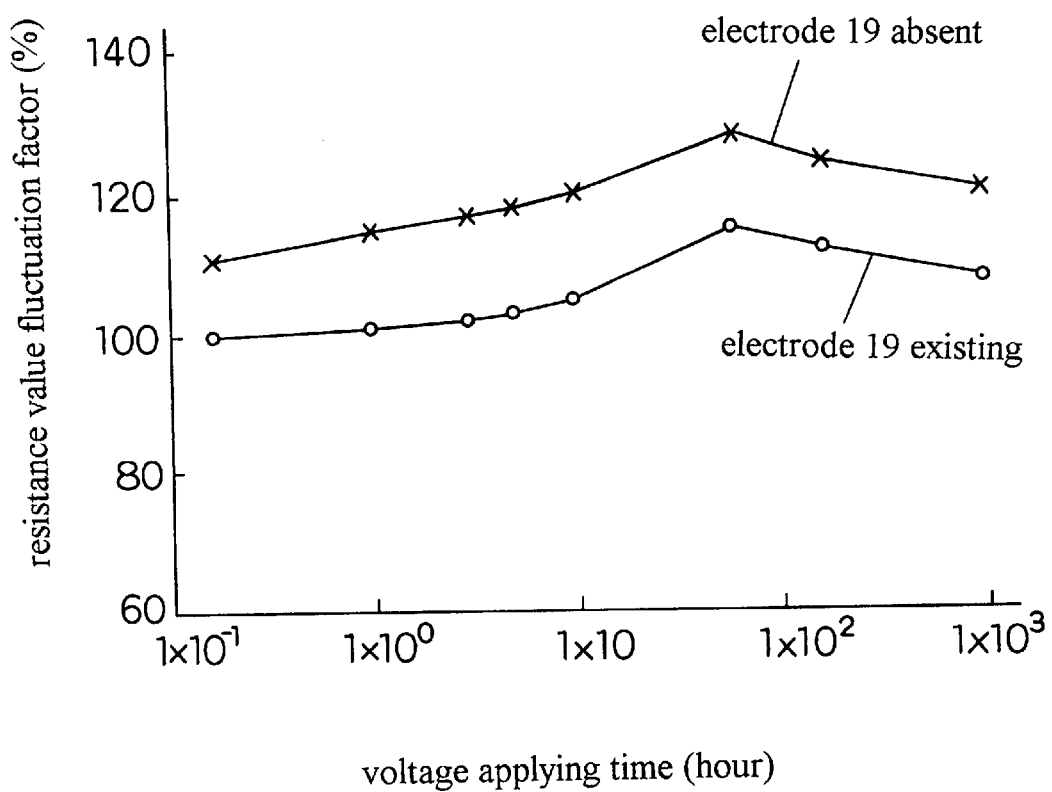
FIG. 5 is a graph showing the relationship between the voltage impressing time and the resistance value fluctuation factor of the semiconductor apparatus.
Figure 6A:
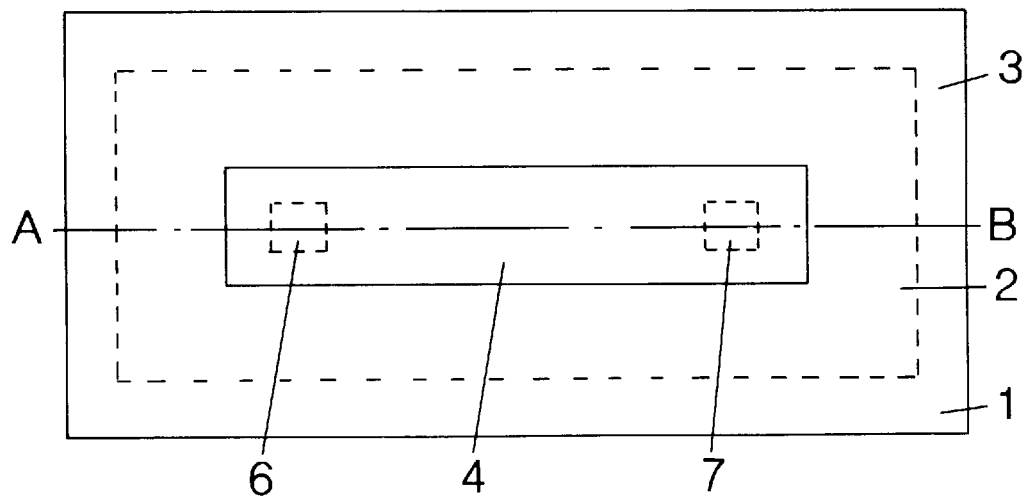
FIG. 6 (A) is a plan view showing the essential portions of the conventional semiconductor apparatus.
Figure 6B:
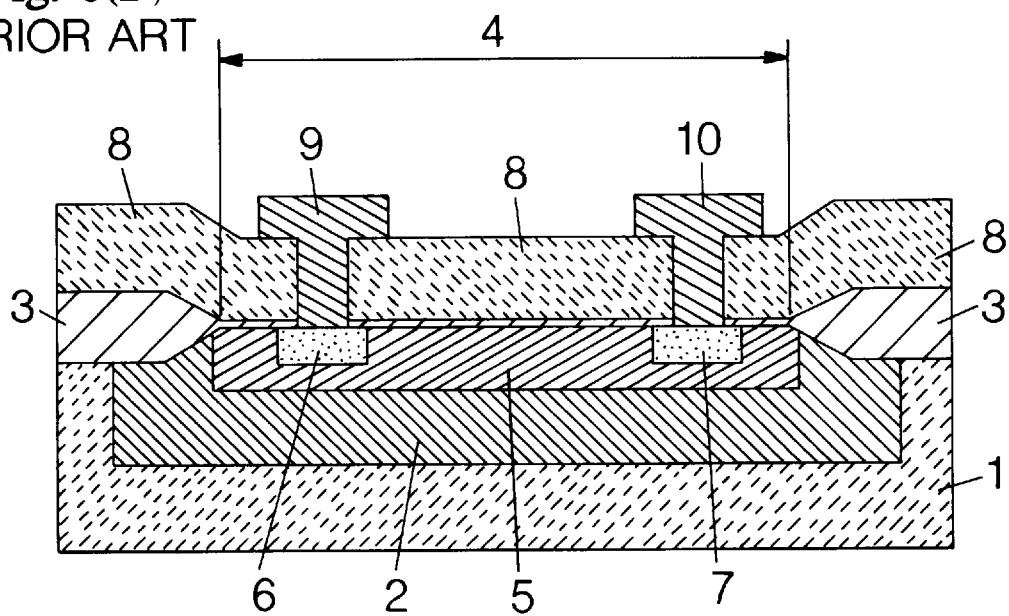

According to the embodiments of the inventors, in the aforementioned construction, a semiconductor resistance apparatus where a desired (approximately 70 kΩ) resistance value can be obtained, wherein the width of the second impurity diffusion layer 12 is 12 μm, the width of the active area 14 is 3 μm, the distance between the impurity diffusion layers 16 and 17 is 100 μm, and the width of the electrode film 19 is 6 μm. In this case, the fluctuations of the resistance value is 15% or lower before and after 1000 hours' application of the voltage of −35V upon the aluminum electrodes 21 through 23 and of the voltage of +7V upon the semiconductor substrate 11 under the temperature of 150° C. The fluctuations of the resistance value are improved as approximately half through the comparison with those when the electrode 19 is not provided. The results are shown in FIG. 5. The o mark in FIG. 5 shows a case when the electrode film 19 is provided, while the x mark shows a case where the electrode film 19 is not provided.

(Second Embodiment)

Figure 3A:
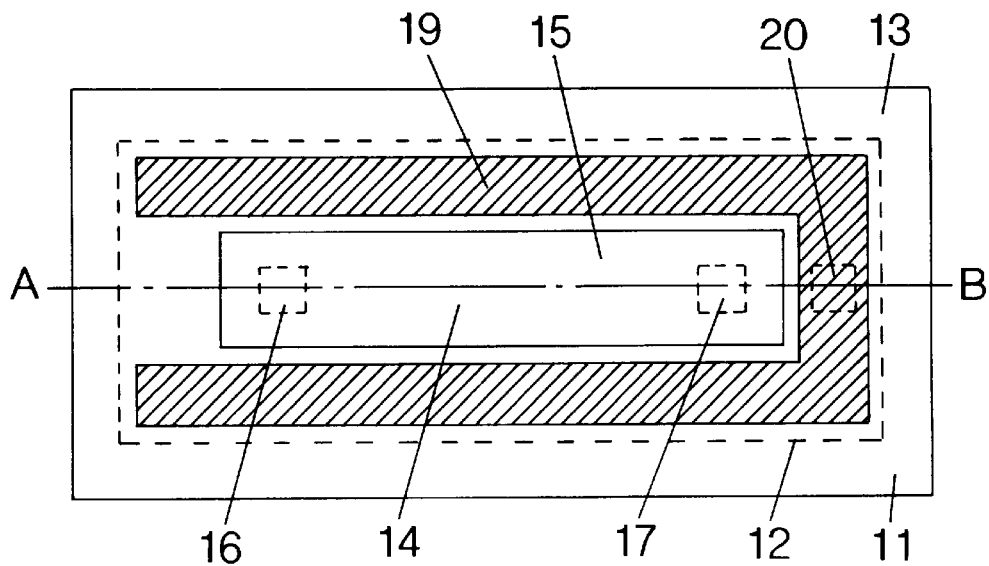
FIG. 3 (A) is a plan view in a second embodiment of the semiconductor apparatus of the invention.
Figure 3B:
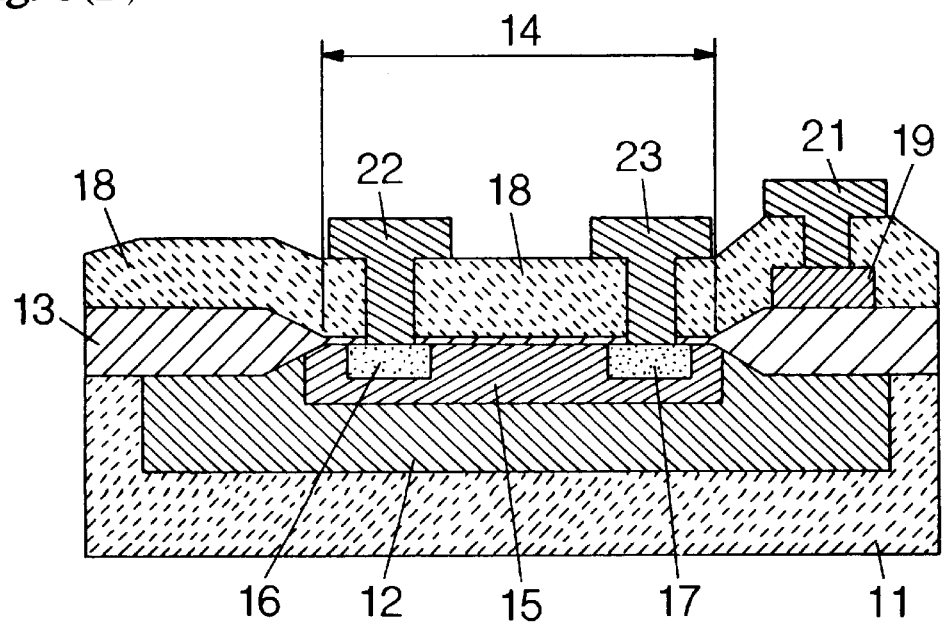

FIG. 3 (A) is a plan view of a semiconductor apparatus in a second embodiment of the invention. FIG. 3 (A) is a sectional view taken along a line A-B in FIG. 3 (A). In the FIG. 3 (A) and FIG. 3 (B), the same reference numerals are given to the components corresponding to those of the embodiments of FIG. 1 and FIG. 2 (A), FIG. 2 (B).

The embodiment is different from that of the FIG. 1 in that the electrode film 19 is adapted to surround three sides of the active area 14 as shown in FIG. 3 (A) in the embodiment, although the shape of the electrode film 19 is ring-shaped in the first embodiment.

In the case of the second embodiment, the insulation resisting property of the layer insulation film 18 can be improved between the electrode film 19 and the aluminum electrode 22 in addition to the operation in the first embodiment, even under the using conditions where the high tension is applied between the electrode film 19 and the aluminum electrode 22 connected with the impurity diffusion layer 16.

In the embodiment, the aforementioned empty layer is formed near the aluminum electrode 23, instead of the aluminum electrode 22, because the aluminum electrode 23 is connected with the Vpp power source (−30V). In order to restrain the formation of the empty layer, the electrode film 19 has only to be formed in the periphery portion of at least the aluminum electrode 23. Therefore, the area is restricted much smaller than the electrode film 19 shown in FIG. 3 (A). Namely, in FIG. 3 (A), for example, the left half portion of electrode film 19, is unnecessary. The left half portion of the band-shaped electrode film 19 formed in parallel to the line of A-B in the drawing, with aluminum electrodes 22 and 23 being surrounded, may be deleted, so as to form the electrode film with the area of the right half portion remaining.

(Third Embodiment)

Figure 4A:
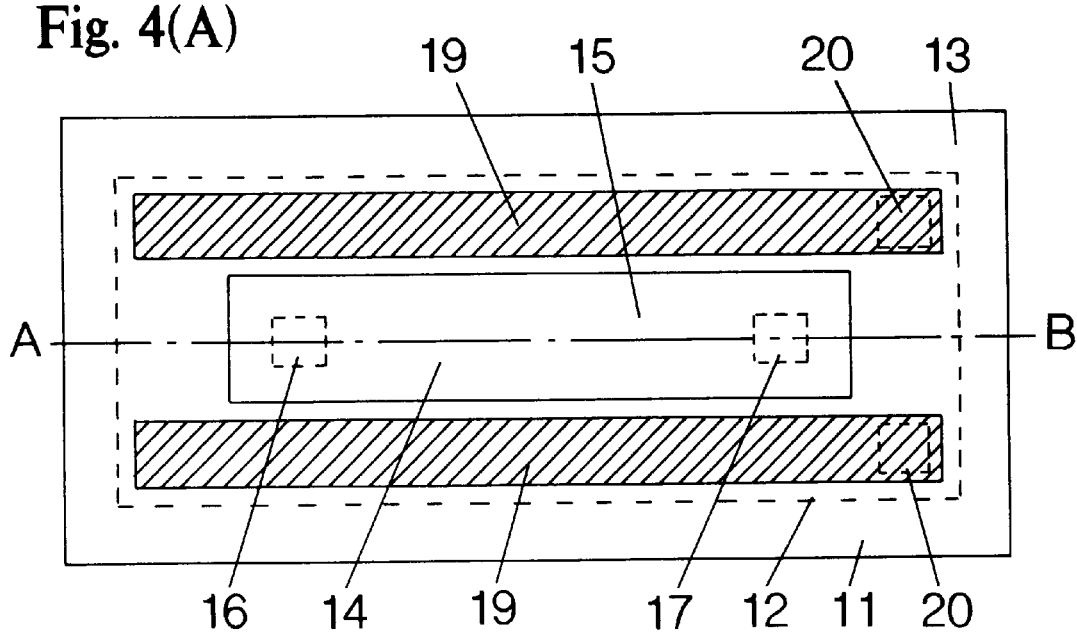
FIG. 4 (A) is a plan view in a third embodiment of the semiconductor apparatus of the invention.
Figure 4B:
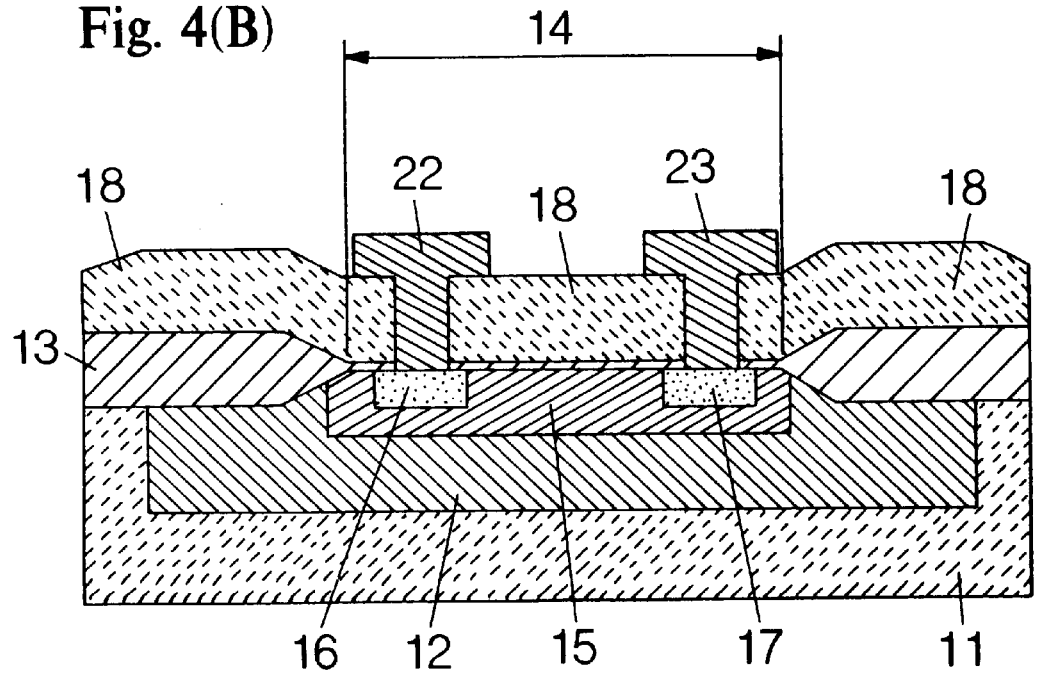

FIG. 4 (A) is a plan view of a semiconductor apparatus in a third embodiment of the invention. FIG. 4 (B) is a sectional view taken along a line A-B in FIG. 4 (A). In FIG. (4) and FIG. (B), the same reference numerals are given to the components corresponding to those of the embodiments of FIG. 1 and FIG. 2 (A), FIG. 2 (B).

The embodiment is different from that of the FIG. 1 in that the electrode film 19 is adapted to surround two sides of the active area 14 as shown in FIG. 3 (A) in this embodiment, although the shape of the electrode film 19 is ring-shaped in the first embodiment.

In the case of the third embodiment, the insulation resisting property of the layer insulation film 18 can be improved between the electrode film 19 and the aluminum electrodes 22, 23 in addition to the operation in the first embodiment, even under the using conditions where the high tension is applied between the electrode film 19 and the aluminum electrodes 22, 23 connected with the impurity diffusion layers 16, 17. Further, the electric characteristics of the semiconductor resistance apparatus is less in deterioration due to the mutual parallel formation of the electrode film 19 when the electrode film 19 is offset, with respect to the active area 14, along the direction of the electrode film 19.

As apparent from the aforementioned description, a first invention is a semiconductor apparatus, for making an electric potential of the electrode film an electric potential where the majority carrier is induced into the second impurity diffusion layer, or for keeping an electric potential of the electrode film at an electric potential where the majority carrier is induced into the second impurity diffusion layer, comprises, for example, an active area formed on the first conductive-type semiconductor substrate or the well surface, a first impurity diffusion layer formed on the active area, of an inverted conductive type which has a contrary characteristics to the first conductive-type semiconductor substrate or the well, a second impurity diffusion layer of the inverted conductive type formed to surround the first impurity diffusion layer, and an electrode film formed through at least the field oxide film on the second impurity diffusion layer so as to surround the active area like a ring shape. In the first invention, electric influences caused by the carriers trapped in the filed oxide film can be reduced considerably, so as to largely restrain the time dependent fluctuation of the resistance value.

A second invention is a semiconductor apparatus, for making an electric potential of the electrode film an electric potential where the majority carrier is induced into the second impurity diffusion layer or for keeping an electric potential of the electrode film at an electric potential where the majority carrier is induced into the second impurity diffusion layer, comprises, for example, an active area formed on the first conductive type semiconductor substrate or the well surface, a first impurity diffusion layer formed on the active area, of an inverted conductive type, a second impurity diffusion layer of the reverse conductive type formed to surround the first impurity diffusion layer, and an electrode film formed through at least the field oxide film on the second impurity diffusion layer, so as to surround the three sides of the active area. In the second invention, electric influences caused by the carriers trapped in the filed oxide film can be reduced considerably, so as to largely restrain the time dependent fluctuation of the resistance value. Furthermore, the insulation resisting property of the layer insulating film between the electrode film and the aluminum electrode can be improved even under the usage conditions where the high voltage is applied between the aluminum electrode connected with the first impurity diffusion layer and the electrode film.

Furthermore, a third invention is a semiconductor apparatus, for making an electric potential of the electrode film an electric potential where the majority carrier are induced into the second impurity diffusion layer or for keeping an electric potential of the electrode film at an electric potential where the majority carrier is induced into the second impurity diffusion layer, comprises, for example, an active area formed on the first conductive type semiconductor substrate or the well surface, a first impurity diffusion layer formed on the active area, of an inverted conductive type, a second impurity diffusion layer of the reverse conductive type formed to cover the first impurity diffusion layer, and two electrode films formed through at least the field oxide film on the second impurity diffusion layer, so as to surround two sides of the active area. In the third invention, electric influences caused by the carriers trapped in the filed oxide film can be reduced considerably, so as to largely restrain the time dependent fluctuation of the resistance value. Furthermore, the insulation resisting property of the layer insulating film between the electrode film and the aluminum electrode can be improved even under the usage conditions where the high voltage is applied between the aluminum electrode connected with the first impurity diffusion layer and the electrode film. Also, the characteristics are less in deterioration due to the mutual parallel formation of the electrode film when the electrode film is offset, with respect to the active area, in position in the longer side direction of the electrode film.

In the aforementioned embodiments, needless to say, the same effects can be obtained even if the semiconductor apparatus is formed on the well although the semiconductor apparatus is formed on the semiconductor substrate 11.

In the aforementioned embodiment, the semiconductor apparatus can be formed of the N-type impurity diffusion layer although the apparatus is of the P-type impurity diffusion layer. In the N type impurity diffusion layer, the semiconductor substrate or the well becomes the P-type where the polarity of the power source becomes reverse.

Also, in the aforementioned embodiment, the contact hole 20 provided onto the electrode film 19, formed by one at the right end of the electrode film 19, can be formed by an optional number in the optional location onto the electrode film 19.

As described above, the invention has an electrode film formed on the field oxide film. The electric potential where the majority carrier can be induced into the impurity diffusion layer which becomes resistor can be retained with the electric film provided on the field oxide film so that electric influences caused by the carriers trapped in the filed oxide film can be reduced considerably, so as to largely restrain the time dependent fluctuation of the resistance value.

What is claimed is:

1. A semiconductor apparatus which comprises a diffusion resistor including a first impurity diffusion layer, comprising:

a semiconductor substrate of a first conductive type;

said first impurity diffusion layer formed in said semiconductor substrate by diffusing an impurity of an opposite conductive type to said first conductive type;

a second impurity diffusion layer formed in said semiconductor substrate to contiguously surround a bottom surface and a side surface of said first impurity diffusion layer, by diffusing an impurity of the same conductive type as said first impurity diffusion layer;

an oxide film formed on said second impurity diffusion layer surrounding said side surface of said first impurity diffusion layer;

an electrode film formed on said oxide film, not covering said first impurity diffusion layer, and electrically insulated from said diffusion resistor; and two electrodes electrically connected to said first impurity diffusion layer, wherein said electrode film is electrically connected to applying means having an electric potential capable of inducing a number of carriers in said second impurity diffusion layer located under said electrode film.

2. A semiconductor apparatus according to claim 1, wherein said electrode film is formed to surround a surface area of said first impurity diffusion layer.

3. A semiconductor apparatus according to claim 1, wherein said first impurity diffusion layer includes a surface area having a plurality of sides, and said electrode film is formed to surround three of said plurality of sides.

4. A semiconductor apparatus according to claim 1, wherein said first impurity diffusion layer includes a surface area having a plurality of sides, and said electrode film is formed to surround two of said plurality.

5. A semiconductor apparatus according to claim 1, wherein one of said two electrodes is further connected to said applying means.

6. A semiconductor apparatus according to claim 1, wherein an impurity concentration of said first impurity diffusion layer is higher than an impurity concentration of said second impurity diffusion layer.

7. A semiconductor apparatus according to claim 1, wherein said two electrodes are electrically connected, for the purpose of making an ohmic contact, to said first impurity diffusion layer through a corresponding pair of third impurity diffusion layers of the same conductive type as said first impurity diffusion layer, each third impurity diffusion layer of said pair of third impurity diffusion layers being formed at a connection position within said first impurity diffusion layer.

* * * * *